US010993325B2

(12) United States Patent
Trelford et al.

(10) Patent No.: US 10,993,325 B2
(45) Date of Patent: Apr. 27, 2021

(54) INTERPOSER PRINTED CIRCUIT BOARDS FOR POWER MODULES

(71) Applicant: ABB Power Electronics Inc., Plano, TX (US)

(72) Inventors: John Andrew Trelford, Richardson, TX (US); Richard John Yeager, Rockwall, TX (US); Alok Kumar Lohia, Dallas, TX (US); Thang Danh Truong, Grand Prairie, TX (US)

(73) Assignee: ABB Power Electronics Inc., Plano, TX (US)

( * ) Notice: Subject to any disclaimer, the term of this patent is extended or adjusted under 35 U.S.C. 154(b) by 0 days.

(21) Appl. No.: 16/528,505

(22) Filed: Jul. 31, 2019

(65) Prior Publication Data

US 2021/0037648 A1 Feb. 4, 2021

(51) Int. Cl.
*H05K 1/14* (2006.01)
*H01L 23/00* (2006.01)
*H05K 7/10* (2006.01)

(52) U.S. Cl.
CPC ............. *H05K 1/145* (2013.01); *H01L 24/13* (2013.01); *H05K 1/144* (2013.01); *H05K 1/14* (2013.01); *H05K 7/1061* (2013.01)

(58) Field of Classification Search
CPC .......... H05K 1/145; H05K 1/144; H05K 1/14; H05K 7/1061; H01L 24/13; H01L 25/0657; H01K 1/0262
USPC ............ 257/686.689; 438/109; 361/767, 772
See application file for complete search history.

(56) References Cited

U.S. PATENT DOCUMENTS

| | | |
|---|---|---|
| 4,642,889 A | 2/1987 | Grabbe |
| 5,218,761 A | 6/1993 | Maniwa et al. |
| 5,258,648 A | 11/1993 | Lin |
| 5,491,303 A | 2/1996 | Weiss |
| 5,994,774 A | 11/1999 | Siegel et al. |
| 6,432,744 B1 | 8/2002 | Amador et al. |
| 6,952,049 B1 | 10/2005 | Ogawa et al. |
| 8,237,274 B1 | 8/2012 | Rahman |
| 9,653,443 B2 | 5/2017 | Cheng et al. |
| 9,698,132 B1 | 7/2017 | Ady et al. |
| 10,504,848 B1 | 12/2019 | Parto |

(Continued)

OTHER PUBLICATIONS

Yue Li et al., "Interposer Connection Reliability using Double-Side Solder Bump for Board-Level Vertical Interconnection", 18th International Conference on Electronic Packaging Technology, 2017, pp. 501-504.

*Primary Examiner* — Thinh T Nguyen

(74) *Attorney, Agent, or Firm* — Barnes & Thornburg LLP

(57) ABSTRACT

Interposer printed circuit boards for power modules and associated methods are disclosed. In at least one illustrative embodiment, a printed circuit board assembly may comprise a printed circuit board having a surface, an electrical component mounted on the surface, a pin mounted on the surface, and an interposer printed circuit board mounted on the surface. The electrical component may have a first height orthogonal to the surface. The pin may have a second height orthogonal to the surface, where the second height is greater than the first height. The interposer printed circuit board may comprise a pad and an outer solder bump positioned on the pad. The outer solder bump may have a third height orthogonal to the surface, where the third height is greater than the first height.

17 Claims, 7 Drawing Sheets

(56) References Cited

U.S. PATENT DOCUMENTS

| | | |
|---|---|---|
| 2002/0074161 A1 | 6/2002 | Jensen |
| 2003/0058628 A1 | 3/2003 | Boylan et al. |
| 2003/0085628 A1* | 3/2003 | Boylan et al. ............ H05K 1/14 |
| | | 361/767 |
| 2004/0100778 A1 | 5/2004 | Vinciarelli et al. |
| 2005/0029652 A1 | 2/2005 | Cuff et al. |
| 2007/0181908 A1 | 8/2007 | Otremba |
| 2009/0145636 A1 | 6/2009 | Miki et al. |
| 2009/0296360 A1* | 12/2009 | Doblar et al. ................ 361/767 |
| 2012/0199960 A1 | 8/2012 | Cosue et al. |
| 2014/0092574 A1 | 4/2014 | Zillmann et al. |
| 2014/0151891 A1 | 6/2014 | Takano et al. |
| 2015/0115466 A1 | 4/2015 | Kim |
| 2016/0027764 A1 | 1/2016 | Kim et al. |
| 2017/0354031 A1 | 12/2017 | Aoki et al. |
| 2018/0041003 A1 | 2/2018 | Dominguez et al. |
| 2018/0374788 A1 | 12/2018 | Nakagawa et al. |
| 2019/0103346 A1 | 4/2019 | Goh et al. |
| 2019/0260110 A1 | 8/2019 | Thai et al. |
| 2019/0305402 A1 | 10/2019 | Dalmia et al. |
| 2019/0305430 A1 | 10/2019 | Thai et al. |
| 2019/0348749 A1 | 11/2019 | Thai et al. |
| 2019/0372198 A1 | 12/2019 | Dalmia et al. |
| 2019/0372229 A1 | 12/2019 | Dalmia et al. |
| 2020/0029431 A1 | 1/2020 | Hayashi |
| 2020/0098621 A1 | 3/2020 | Bharath et al. |
| 2020/0098676 A1 | 3/2020 | Eisherbini et al. |
| 2020/0203470 A1 | 6/2020 | Dhane et al. |
| 2020/0203839 A1 | 6/2020 | Karhade et al. |
| 2020/0219816 A1 | 7/2020 | Aleksov et al. |
| 2020/0258839 A1 | 8/2020 | Aleksov et al. |
| 2020/0321375 A1 | 10/2020 | Wu |
| 2020/0365510 A1 | 11/2020 | Lin et al. |
| 2021/0037649 A1 | 2/2021 | Trelford et al. |

* cited by examiner

| POWER PIN WITH PWB AND VIAS | | POWER PIN WITH COPPER BLOCK PIN | |
|---|---|---|---|
| BOARD THICKNESS (MILS) = | 72 | BLOCK PIN THICKNESS MILS | 67 |
| VIA DIAMETER (MILS) = | 13 | BLOCK PIN WIDTH | 80 |
| VIA PLATING (MILS) = | 2 | BLOCK PIN LENGTH | 210 |
| NUMBER OF VIAS | 24 | | |
| CURRENT (AMPS) = | 60 | | |
| TEMPERATURE (DEC.C) = | 85 | | |
| | | | |
| COPPER RESISTIVITY (OHM X METER) = | 1.68E-08 | | |
| COPPER TEMPERATURE COEFFICIENT PER DEGREES C = | 0.004041 | | |
| COPPER RESISTIVITY (OHM X METER) = | 0.00066142 | | |
| | | | |
| OUTSIDE AREA (MILS^2) = | 226.865 | | |
| INSIDE AREA (MILS^2) = | 132.665 | | |
| ONE VIA COPPER AREA (MILS^2) = | 94 | | |
| TOTAL COPPER AREA IN VIAS (MILS^2) = | 2261 | BLOCK PIN AREA (MILS^2) | 16800 |
| | | | |
| INTERCONNECT RESISTANCE (OHMS) AT 20C= | 2.1064E-05 | INTERCONNECT RESISTANCE (OHMS) AT 20C = | 2.63779E-06 |
| INTERCONNECT RESISTANCE (OHMS) AT REQUESTED TEMPERATURE= | 2.6597E-05 | INTERCONNECT RESISTANCE (OHMS) AT REQUESTED TEMPERATURE = | 3.33065E-06 | 8.0 :CONDUCTANCE IMPROVEMENT FACTOR |
| | | | |
| POWER LOSS OF PWB INTERCONNECT PIN (WATTS) = | 0.0957 | POWER LOSS OF INTERCONNECT PIN (WATTS) | 0.0120 |

*FIG. 9*

INTERPOSER PRINTED CIRCUIT BOARDS FOR POWER MODULES

CROSS-REFERENCE TO RELATED APPLICATIONS

Cross-reference is made to U.S. patent application Ser. No. 16/528,510, which is entitled "Interposer Printed Circuit Boards for Power Modules," is filed Jul. 31, 2019, is assigned to the same assignee as the present application, and is incorporated by reference herein in its entirety.

TECHNICAL FIELD

The present disclosure relates to power modules and, more particularly, to interposer printed circuit boards for power modules.

BACKGROUND

Generally, power modules with bottom side surface mount technology parts use single pin connectors or surface mount headers. The trend in printed circuit board ("PCB") mounted power modules is that the footprint areas of the modules are getting smaller while the number of signal output pins is increasing. The output current of the power carrying pins is also increasing. Additionally, printed circuit boards ("PCBs") now use thinner stencils as the pitch of surface mount technology pins decreases. Due to this trend, co-planarity of less than 4 mils may be needed. To achieve the desired power density, it is often necessary to put surface mount technology components on the bottom side of the printed circuit board.

The interconnect pins needed to provide a standoff for bottom side surface mount technology part clearance prevent the use of low cost land grid array pads. Furthermore, fitting all of the output pins on the bottom side of the PCB may require a smaller pitch for the pins. Additionally, it is desirable to have a lower cost solution for the discrete output pins in order to meet target costs for the power modules.

SUMMARY

The present disclosure includes one or more of the features recited in the appended claims and/or the following features which, alone or in any combination, may comprise patentable subject matter.

According to one aspect of the present disclosure, a printed circuit board assembly may comprise a printed circuit board having a surface, an electrical component mounted on the surface, a pin mounted on the surface, and an interposer printed circuit board mounted on the surface. The electrical component may have a first height orthogonal to the surface. The pin may have a second height orthogonal to the surface, where the second height is greater than the first height. The interposer printed circuit board may comprise a pad and an outer solder bump positioned on the pad. The outer solder bump may have a third height orthogonal to the surface, where the third height is greater than the first height.

In some embodiments, the third height may be equal to the second height after a reflow soldering process alters the outer solder bump.

In some embodiments, the printed circuit board assembly may further comprise an inner solder bump positioned between the interposer printed circuit board and the surface of the printed circuit board.

In some embodiments, the third height may be equal to the second height after a reflow soldering process alters the inner solder bump.

In some embodiments, the pin may be a discrete pin with greater thermal and electrical conductivity than a signal path through the interposer circuit board.

In some embodiments, the pin may be configured to transmit power signals.

In some embodiments, the pin may be gold plated.

In some embodiments, the pad may be configured to transmit control signals.

In some embodiments, the interposer printed circuit board may comprise a plurality of top side pads and a plurality of bottom side pads, where each of the plurality of top side pads is aligned with one of the plurality of bottom side pads.

According to another aspect of the present disclosure, a direct current (DC) to direct current (DC) power converter may comprise a printed circuit board having a surface, an electrical component of a power conversion circuit mounted on the surface, a pin mounted on the surface and configured to transmit power signals, and an interposer printed circuit board mounted on the surface, where the interposer printed circuit board comprises a pad that is configured to transmit control signals.

In some embodiments, the pin may be a discrete pin with greater thermal and electrical conductivity than a signal path through the interposer circuit board.

In some embodiments, the pin may be gold-plated.

In some embodiments, the electrical component may have a first height orthogonal to the surface, the pin may have a second height orthogonal to the surface, the second height being greater than the first height, and an outer solder bump positioned on the pad may have a third height orthogonal to the surface, the third height being greater than the first height.

In some embodiments, the third height may be equal to the second height after a reflow soldering process alters the outer solder bump.

In some embodiments, the DC-to-DC power converter may further comprise an inner solder bump positioned between the interposer circuit board and the surface of the printed circuit board, wherein the third height is equal to the second height after the reflow soldering process alters the inner solder bump.

According to yet another aspect of the present disclosure, a method of forming a power module may comprise mounting an electrical component of a power conversion circuit on a surface of a printed circuit board, mounting a pin on the surface, and mounting an interposer printed circuit board on the surface, where the electrical component has a first height orthogonal to the surface, the pin has a second height orthogonal to the surface, the second height is greater than the first height, the pin is configured to transmit power signals, the interposer printed circuit board comprises a pad configured to transmit control signals and an outer solder bump positioned on the pad, the outer solder bump has a third height orthogonal to the surface, and the third height is greater than the first height.

In some embodiments, the method may further comprise reflow soldering the printed circuit board to alter the outer solder bump such that the third height is equal to the second height.

In some embodiments, the method may further comprise positioning an inner solder bump between the interposer circuit board and the surface of the printed circuit board, wherein reflow soldering the printed circuit board also alters the inner solder bump such that the third height is equal to the second height.

In some embodiments, the method may further comprise gold-plating the pin.

In some embodiments, the pin may be a discrete pin with greater thermal and electrical conductivity than a signal path through the interposer circuit board.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which:

FIG. 9 is a chart illustrating improvement in both thermal and electrical conduction when using discrete pins with an interposer printed circuit board as described herein.

DETAILED DESCRIPTION OF THE DRAWINGS

Figure 1:
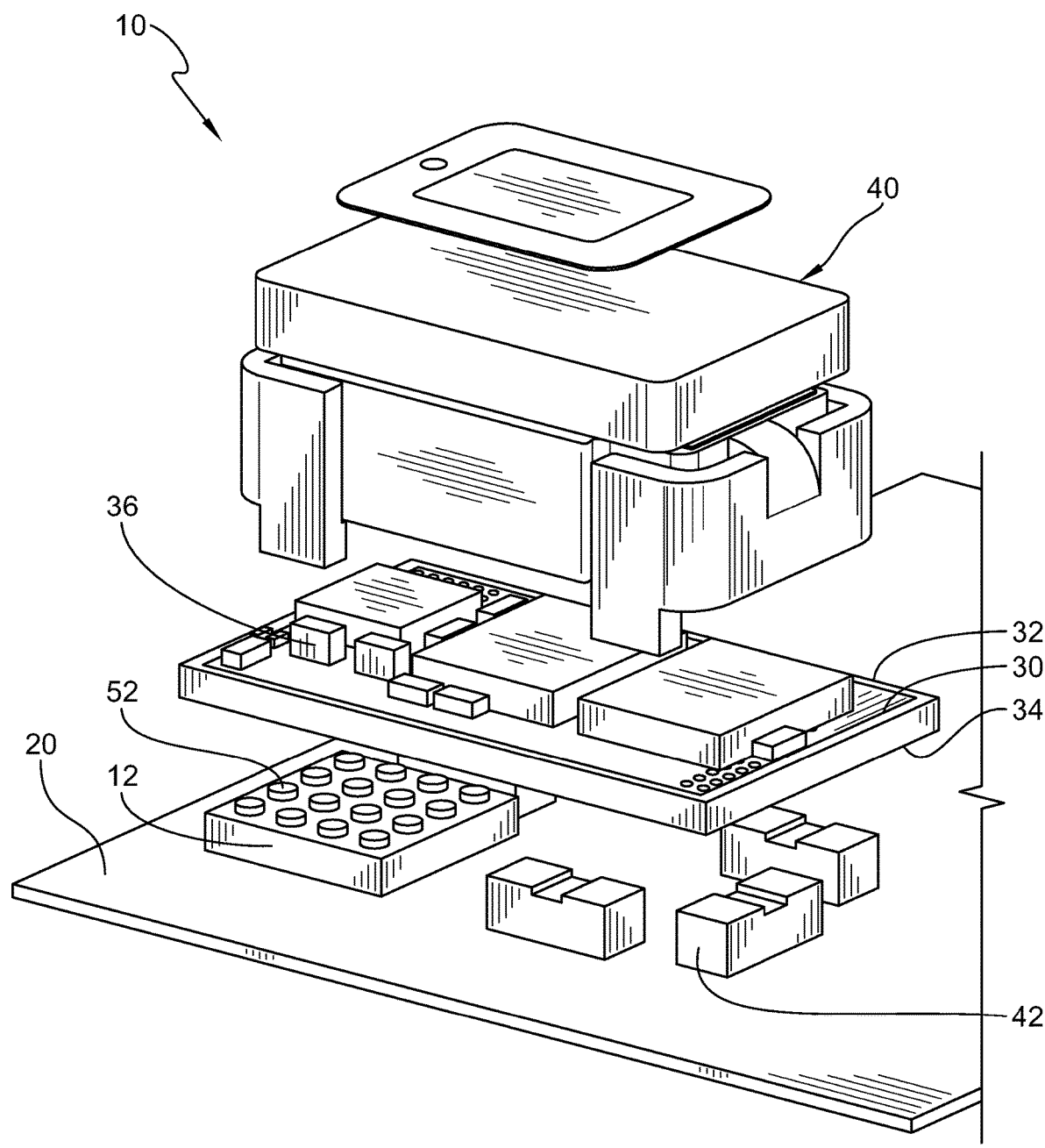
FIG. 1 is an exploded view of one illustrative embodiment of a power module configured to be mounted on a motherboard.

While the concepts of the present disclosure are susceptible to various modifications and alternative forms, specific embodiments thereof have been shown by way of example in the figures and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring to FIG. 1, one illustrative embodiment of a power module 10 uses an interposer printed circuit board (PCB) 12 as the interconnect for the power module 10. The power module 10 may be a direct current (DC) to direct current (DC) power converter. The interposer PCB 12 also provides a standoff to provide clearance for bottom side surface mount technology (SMT) parts. Applied solder bumps (described in more detail below) on interposer PCB 12 collapse during the customer reflow so that solder connections can be made using customer stencil thicknesses anywhere from 1 mil to 8 mils thick. As used herein, the term "mil" is used to describe a one thousandth of an inch. The power module 10 is an improvement over discrete pins since it allows tighter pad spacing than discrete pin solutions. The power module 10 reduces assembly cost by replacing multiple pin placements with one interposer PCB 12. The power module 10 also reduces interconnect pin material cost. Further, the power module 10 eliminates need to make solder bumps co-planar before assembly on a motherboard 20.

The power module 10 includes a main circuit board 30 having a top side 32 and a bottom side 34. A plurality of electronic components 36, such as capacitors and resistors, is positioned on the top side 32 of the main circuit board 30. An inductor or transformer 40 is configured to couple to the top side 32 of the main circuit board 30. A plurality of pins 42, for example tin plated pins or gold plated pins, is configured to be mounted to the bottom side 34 of the main circuit board 30. In some embodiments, the pins 42 are discrete pins with greater thermal and electrical conductivity than a signal path through an interposer printed circuit board 12. In some embodiments, the pins 42 are configured to transfer power signals between the main circuit board 30 and the motherboard 20. For example, the pins 42 may transfer 60 amps between the main circuit board 30 and the motherboard 20. In some embodiments, the pins 42 are configured to transfer control signals between the main circuit board 30 and the motherboard 20. An interposer printed circuit board 12 is also configured to be coupled to the bottom side 34 of the main circuit board 30. The interposer printed circuit board 12 includes a plurality of pads with added solder bumps 52, for example copper pads or gold plated pads. In some embodiments, the pads with added solder bumps 52 are configured to transmit control signals to between the main circuit board 30 and the motherboard 20. In some embodiments, the pads with added solder bumps 52 are configured to transmit power signals to between the main circuit board 30 and the motherboard 20.

Figure 2:
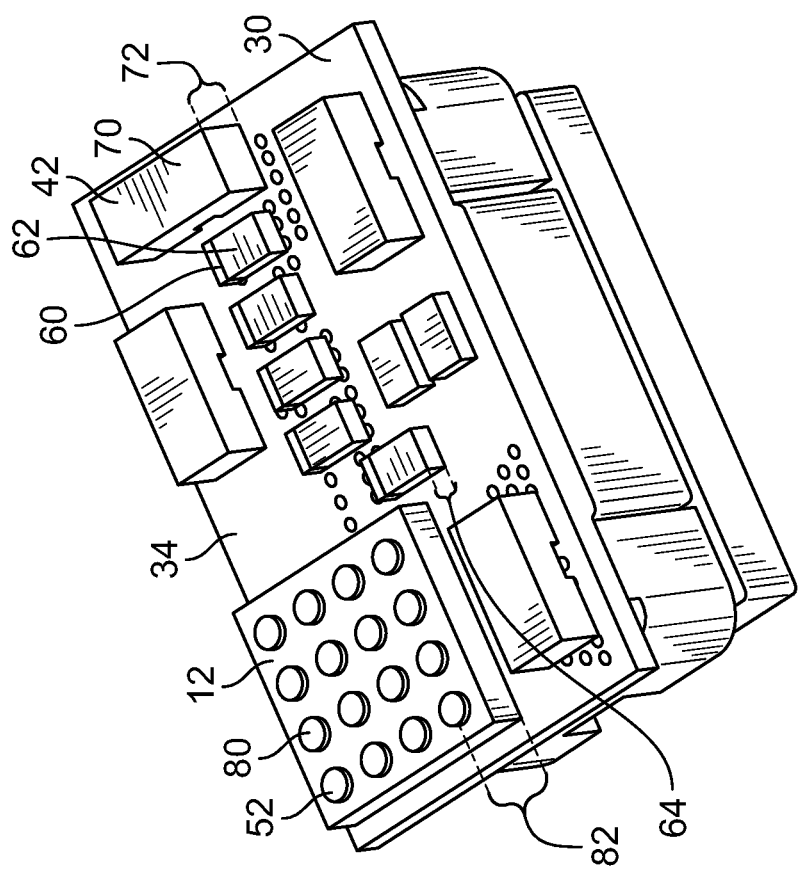
FIG. 2 is a bottom perspective view of the power module of FIG. 1, showing discrete pins and an interposer printed circuit board positioned at a height greater than a height of surface mounted technology components.

Referring to FIG. 2, the bottom side 34 of the main circuit board 30 also includes a plurality of electronic components 60, for example capacitors and resistors, which are surface mounted to the bottom side 34 of the main circuit board 30. The components 60 have a bottom surface 62 that is positioned a height 64 from the bottom side 34 of the main circuit board 30. When the power module 10 is coupled to the motherboard 20, the components 60 are configured to be spaced from the motherboard 20.

The pins 42 are also surface mounted on the bottom side 34 of the main circuit board 30. The pins 42 have a bottom surface 70 that is positioned a height 72 from the bottom side 34 of the main circuit board 30. The height 72 is greater than the height 64 (the heights 64, 72 being measured orthogonal to the bottom side 34). When the power module 10 is coupled to the motherboard 20, the bottom surfaces 70 of the pins 42 are configured to mount to the motherboard 20 so that the pins 42 can transmit signals between the main circuit board 30 and the mother board 20.

The pads with added solder bumps 52 of the interposer printed circuit board 12 includes a bottom surface that is positioned a height 82 from the bottom side 34 of the main circuit board 30. The combined height 82 of the pads with added solder bumps is greater than the height 64 of the components 60 (the heights 64, 82 being measured orthogonal to the bottom side 34). As described in more detail below, solder bumps 90 and 92 (shown in FIG. 3) are positioned on the pads so that a combined height 82 of the pads and the solder bumps 90, 92 is substantially equal to the height 72 of the pins 42. Accordingly, the pads in combination with the solder bumps 90, 92 are in contact with the motherboard 20 to transmit signals between the main circuit board 30 and the motherboard 20, when the power module 10 is coupled to the motherboard 20.

Figure 3:
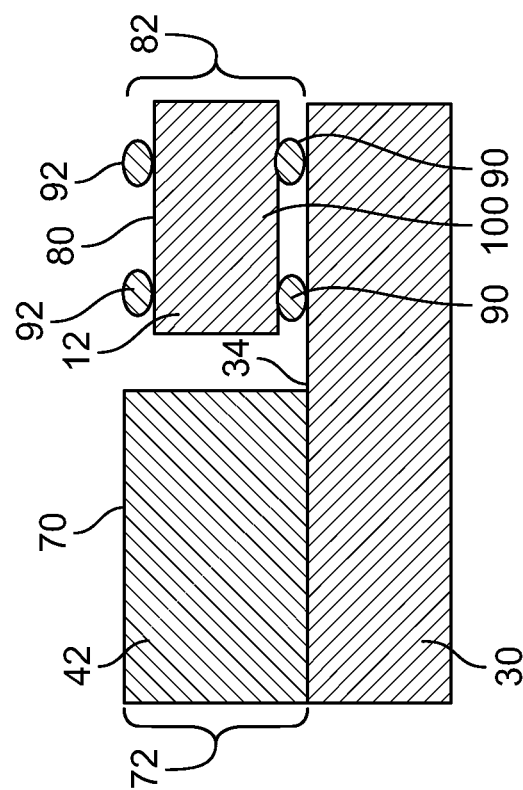
FIG. 3 is a side view diagram of a portion of the power module of FIG. 1, illustrating the interposer printed circuit board and discrete pins mounted on a main circuit board.
Figure 5:
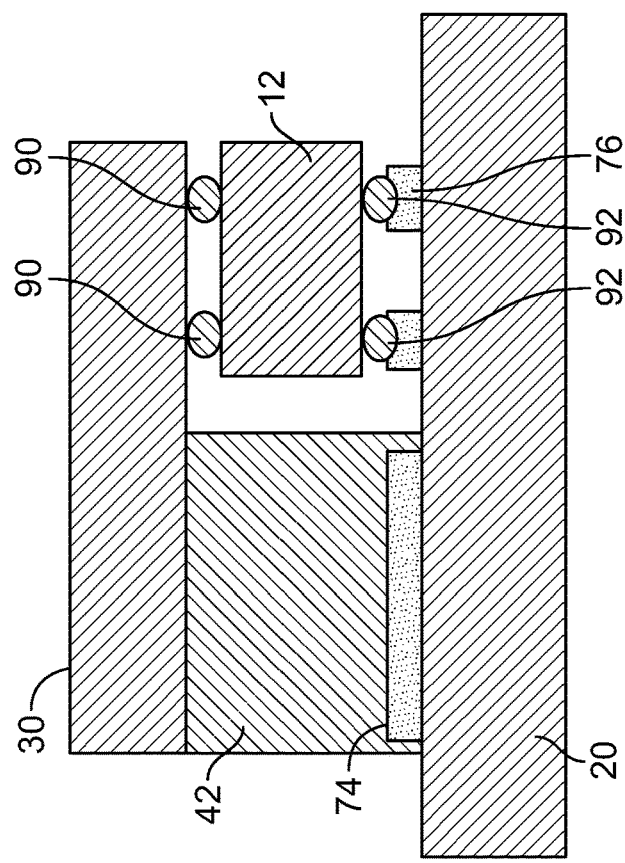
FIG. 5 is another side view diagram of a portion of the power module of FIG. 1, illustrating the interposer printed circuit board and discrete pins mounted on a main circuit board and a motherboard.
Figure 4:
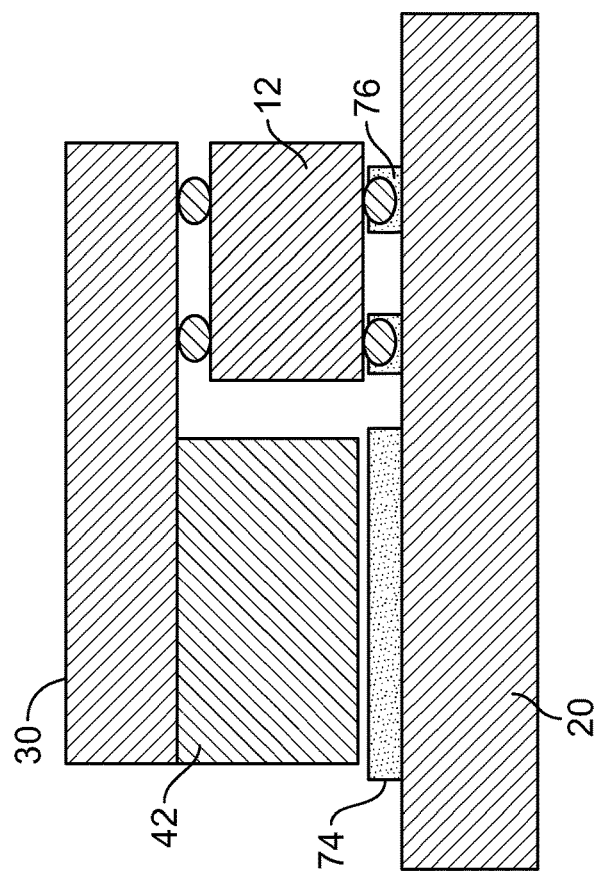
FIG. 4 is a side view diagram of a portion of the power module of FIG. 1, illustrating the interposer printed circuit board and discrete pins mounted on a main circuit board and a motherboard.

Referring now to FIGS. 3-5, a pin 42 is illustrated as being surface mounted on the main circuit board 30. FIG. 3 also illustrates the interposer printed circuit board 12 mounted on the main circuit board 30. Solder bumps 90 are positioned between a top surface 100 of the interposer printed circuit board 12 and the bottom side 34 of the main circuit board 30. Additionally, solder bumps 92 are positioned on a bottom surface 80 of the interposer printed circuit board 30. As shown in FIGS. 4 and 5, solder paste 76 may be added to the solder bumps 92.

In the exemplary embodiment, the pin 42 has a thickness or height 72 of approximately 67 mils±2 mils. Solder paste 74 may be added to the pin 42. In some embodiments, the solder paste 74 has a thickness of 7 mils. Accordingly, the height 72 in the exemplary embodiment of FIG. 3 is approximately within a range of 65 mils to 69 mils. The interposer printed circuit board 12 has a thickness of approximately 53 mils±4 mils. Each solder bump 90, 92 provides an additional height of 8 mils+/−2 mils. Accordingly, the combined height 82 of the interposer printed circuit board 12 in combination with the solder bumps 90, 92 is as great as 74 mils.

When the power module 10 is first assembled, the height 72 may be different than the height 82. The power module 10 is positioned on the motherboard 20 and subjected to a reflow soldering process. During this process, the motherboard 20 is heated with the power module 10 positioned on the motherboard 20. The heat causes the solder bumps 90, 92 to melt so that the combined height 82 of the interposer printed circuit board 12 in combination with the solder bumps 90, 92 becomes equal to the height 72 of the pins 42, so that the power module 10 sits flush on the motherboard 20. When the pins 42 and the pads 52 (via the solder bumps 90, 92) position flush on the motherboard 20, a clearance is provided between the motherboard 20 and the bottom surfaces 62 of the components 60. It should be noted that, the heights and tolerances described herein are exemplary only. One of skill in the art would understand that other heights and tolerances may be utilized to achieve the same result of positioning the power module 10 flush on the motherboard 20 and providing the necessary clearance for the components 60.

In another embodiments, the power module 10 is positioned on a flat plate (not shown) prior to coupling the power module 10 to the motherboard. While on the flat plate, the power module 10 is subjected to reflow heating so that the solder bumps melt and heights 72 and 82 become equal. With the heights 72 and 82 equal, the power module 10 may then be positioned flush on the motherboard 20. In some embodiments, the power module 10 may be reflow heated on the flat plate prior to be coupled to the motherboard 20 and the motherboard 20 may also then be reflow soldered with the power module 10 coupled thereto.

Figure 6:
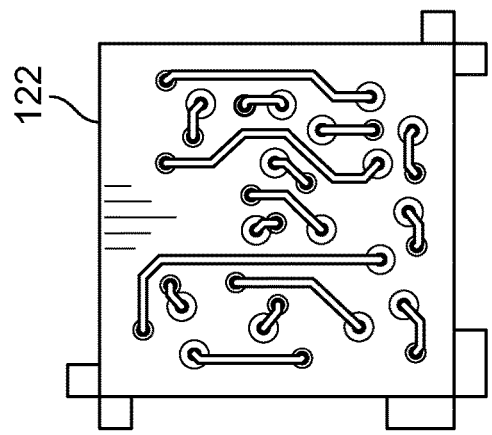
FIG. 6 is a top view diagram of four layers of on illustrative embodiment of an interposer printed circuit board having rerouted connections extending through the layers.
Figure 6:
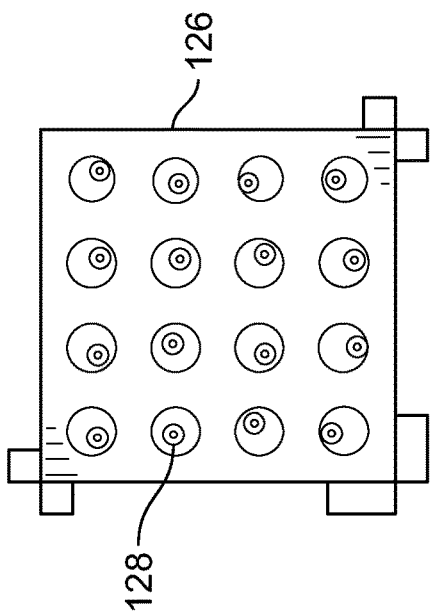
Figure 6:
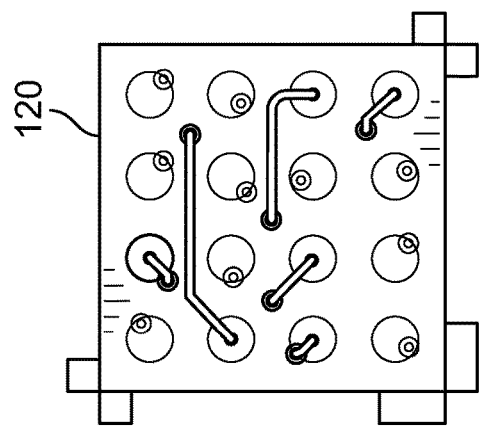
Figure 6:
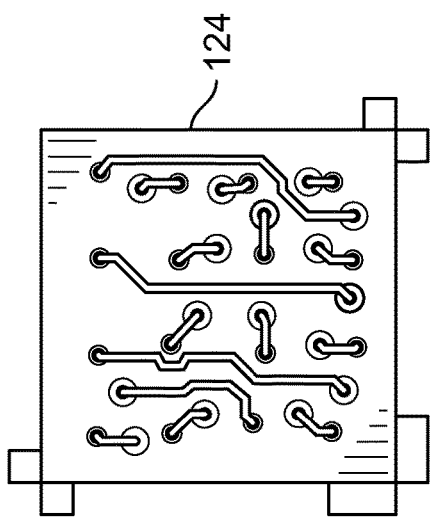

Referring to FIG. 6, the interposer printed circuit board 12 includes a layer 120 that is configured to couple to the main circuit board 30. The layer 120 provides rerouting of the pad 52 connections. Another layer 122 couples to the layer 120 to provide additional rerouting of the pad 52 connections. Yet another layer 124 couples to the layer 122 to provide further rerouting. Finally, a bottom layer 126 provides connections for the interposer printed circuit board 12 to couple to the motherboard 20. The bottom layer 126 does not include any rerouting, but rather, provides vias 128 that connect to pads on the motherboard 20. Accordingly, the signal connections of the main circuit board 30 are rerouted to adapt to the signal connections of the motherboard 20. It should be noted that, the rerouting configurations shown in layers 120, 122, and 124 are exemplary only. It will be appreciated that the interposer printed circuit board 12 may include any other rerouting. In some embodiments, the interposer printed circuit board 12 may not include any rerouting, but rather, the signals may pass directly from layer 120 to layer 126.

The interposer printed circuit board 12 provides a combination of the interposer printed circuit board 12 with discrete pins 42 to achieve a 4 mil co-planarity that is required for surface mount technology power modules. The 4 mil co-planarity is required to accommodate a 5 mil thick stencil. Since the discrete pins 42 have a co-planarity of ±2 mils, the discrete pins 42 meet the 4 mil co-planarity requirement. However, printed circuit boards typically have a ±10% tolerance, which means that a 50 mil thick interposer printed circuit board would have a ±5 mil tolerance. To achieve 4 mil co-planarity, the standoff height of the interposer printed circuit board pads with added solder bumps 52 is adjusted to fall within the same ±2 mil tolerance of the discrete pins 42.

To solve power density, cost, and co-planarity problems, discrete pins 42 are used for high current connections. The high current carrying discrete pins 42 also help to cool the power module 10 by reducing power loss in the pins 42 and allowing the transfer of heat to the main circuit board 30 through the pins 42. For small signal pads with added solder bumps 52, the interposer printed circuit board 12 is used because, compared to discrete pins, the interposer printed circuit board 12 allows more interconnects in a given area due to the tighter spacing which is possible with the interposer pads with added solder bumps 52. Also, by rerouting the pad locations in the smaller interposer printed circuit board 12, the need for extra routing layers in the main circuit board 30 is eliminated, which reduces main circuit board 30 cost. Additionally, by printing solder bumps 90, 92 on the interposer printed circuit board 12 connections can be made for which the co-planarity can be adjusted to match the discrete pins 42. By reflowing the power module 10 on a flat plate, the interposer solder bump height 82 can be forced to be equivalent to the discrete pin height 72. Alternatively, by applying pressure to the power module 10 with a press, it is possible to flatten the interposer printed circuit board solder bumps 90, 92 so they match the 4 mil co-planarity of the discrete pins 42.

As explained above, the power module 10 uses the interposer printed circuit board 12 in combination with discrete surface mount technology pins 42. The interposer printed circuit board 12 provides a standoff for bottom side surface mount technology parts, e.g. electronic components 60. Due to the tolerance mismatch between the interposer printed circuit board 12 and the discrete pins 42, a method is needed to make the interposer printed circuit board pads with added solder bumps 52 match the 4 mil co-planarity of the discrete pins 42. The 4 mil co-planarity allows users to use a required 5 mil thick stencil. The co-planarity match can be achieved by reflowing the power module 10 on a flat plate which causes the solder bumps 90, 92 to reflow so they can be flattened to match the height of the discrete pins 42. The reflow technique can be achieved with or without applying extra mechanical pressure. Alternatively, the solder bumps 90, 92 can be flattened by applying pressure to the solder bumps 90, 92 with a mechanical press. This alternative solution can be done without exposing a singulated module to an additional reflow.

Figure 7:
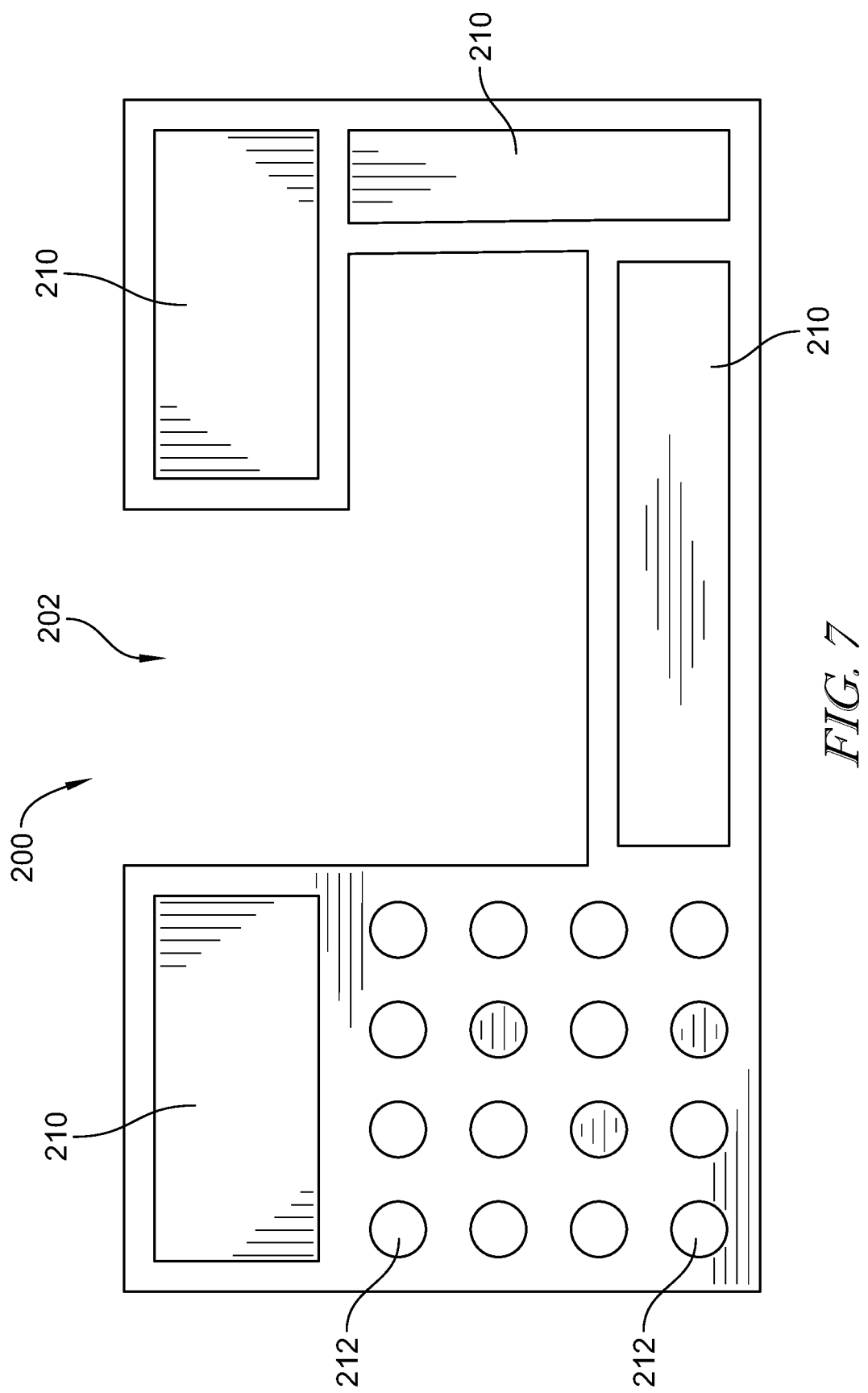
FIG. 7 is a top view diagram of another illustrative embodiment of an interposer printed circuit board configured for use with a power module.

Referring to FIG. 7, another embodiment of an interposer printed circuit board 200 is configured to couple between the main circuit board 30 and the motherboard 20. The interposer printed circuit board 200 eliminates the discrete pins 42 by including them in the interposer printed circuit board 200. The interposer printed circuit board 200 includes a cutout 202 that is sized and shaped to position around the electronic components 60. That is, when the interposer printed circuit board 200 is positioned on the main board 30, the electronic components 60 extend through the cutout 202. The interposer printed circuit board 200 is configured with a height that is greater than the height 64 of the electronic components 60 so that a clearance is provided for the electronic components 60, when the interposer printed circuit board 200 is coupled to the motherboard 20.

A plurality of signal conductors 210 are positioned on the interposer printed circuit board 200. The signal conductors 210 may include metal pads, for example gold pads or copper pads. The signal conductors 210 are configured to transmit power signals between the main circuit board 30 and the motherboard 20. A plurality of signal conductors 212 are also positioned on the interposer printed circuit board 200. The signal conductors 212 are configured to transmit control signals between the main circuit board 30 and the motherboard 20. In some embodiments, the signal conductors 212 include rerouting, as described above. While not shown in FIG. 7, it should be appreciated that the pads of the interposer printed circuit board 200 include vias, similar to those illustrated in FIG. 8.

Figure 8:
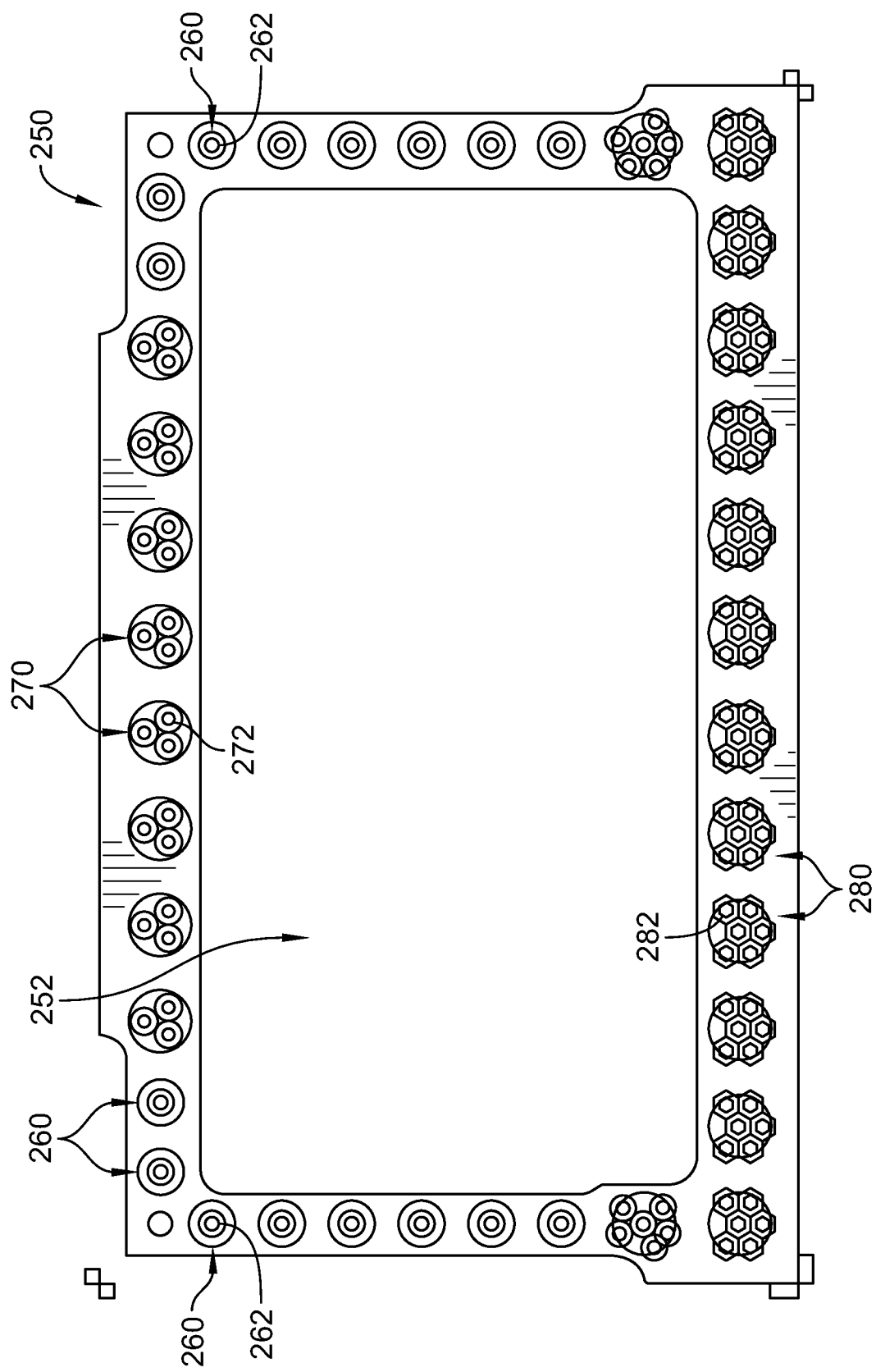
FIG. 8 is a top view diagram of yet another illustrative embodiment of an interposer printed circuit board configured for use with a power module.

Referring to FIG. 8, yet another embodiment of an interposer printed circuit board 250 is configured to couple between the main circuit board 30 and the motherboard 20. All of the routing of the pad positions is done in the main circuit board 30. Accordingly, the interposer printed circuit board 250 is simply a straight pass through of the signals. The interposer printed circuit board 250 still provides the standoff and the co-planarity matching. If all of the signals are routed in the main board, the interposer printed circuit board 250 could also be replaced with a traditional plastic header with embedded metal surface mount technology pins.

The interposer printed circuit board 250 includes a cutout 252 that is sized and shaped to position around the electronic components 60. In the illustrative embodiment, the cutout 252 is centered in the interposer printed circuit board 250. When the interposer printed circuit board 250 is positioned on the main board 30, the electronic components 60 extend through the cutout 252. The interposer printed circuit board 250 is configured with a height that is greater than the height 64 of the electronic components 60 so that a clearance is provided for the electronic components 60, when the interposer printed circuit board 250 is coupled to the motherboard 20. In some embodiments, the interposer printed circuit board 250 may be a plurality of interposer printed circuit boards 250 that position around the electronic components 60. That is, the electronic components 60 extend between a space between at least two interposer printed circuit boards 250.

The interposer printed circuit board 250 includes a plurality of pads 260 that are configured to transmit control signals. The pads 260 include a single copper plated via 262 that is filled with epoxy and copper plated over to transmit the control signals. In the illustrative embodiment, the interposer printed circuit board 250 includes 16 pads 260. In other embodiments, the interposer printed circuit board 250 may include any suitable number of pads 260. In some embodiments, the top pads 260 on a first side of the interposer printed circuit board 250 may be aligned with the bottom pads 260 on a second side of the interposer circuit board 250. Signal paths may be formed between the top pads 260 and the bottom pads 260. In some embodiments, a first signal path may extend between a first top pad 260 and a first bottom pad 260 that is aligned with the first top pad 260. A second signal path may extend between a second top pad 260 and a second bottom pad 260 that is aligned with the second top pad 260. In some embodiments, a first signal path may extend between a first top pad 260 and a first bottom pad 260 that is not aligned with the first top pad 260. A second signal path may extend between a second top pad 260 and a second bottom pad 260 that is not aligned with the second top pad 260.

The interposer printed circuit board 250 also includes a plurality of pads 270 that are configured to transmit power signals at a first current. The pads 270 include three copper plated vias 272 that are filled with epoxy and plated over to transmit the power signals. In the illustrative embodiment, the interposer printed circuit board 250 includes 8 pads 270. In other embodiments, the interposer printed circuit board 250 may include any suitable number of pads 270. In some embodiments, the top pads 270 on a first side of the interposer printed circuit board 250 may be aligned with the bottom pads 270 on a second side of the interposer circuit board 250. Signal paths may be formed between the top pads 270 and the bottom pads 270. In some embodiments, a first signal path may extend between a first top pad 270 and a first bottom pad 270 that is aligned with the first top pad 270. A second signal path may extend between a second top pad 270 and a second bottom pad 270 that is aligned with the second top pad 270. In some embodiments, a first signal path may extend between a first top pad 270 and a first bottom pad 270 that is not aligned with the first top pad 270. A second signal path may extend between a second top pad 270 and a second bottom pad 270 that is not aligned with the second top pad 270.

The interposer printed circuit board 252 also includes a plurality of pads 280 that are configured to transmit power signals at a second current that is greater than the first current. The pads 280 include six copper plated vias 282 that are filled with epoxy and plated over to transmit the power signals. In the illustrative embodiment, the interposer printed circuit board 250 includes 14 pads 280. In other embodiments, the interposer printed circuit board 252 may include any suitable number of pads 280. In some embodiments, the top pads 280 on a first side of the interposer printed circuit board 250 may be aligned with the bottom pads 280 on a second side of the interposer circuit board 250. Signal paths may be formed between the top pads 280 and the bottom pads 280. In some embodiments, a first signal path may extend between a first top pad 280 and a first bottom pad 280 that is aligned with the first top pad 280. A second signal path may extend between a second top pad 280 and a second bottom pad 280 that is aligned with the second top pad 280. In some embodiments, a first signal path may extend between a first top pad 280 and a first bottom pad 280 that is not aligned with the first top pad 280. A second signal path may extend between a second top pad 280 and a second bottom pad 280 that is not aligned with the second top pad 280.

To solve power density, cost, and co-planarity problems, an interposer printed circuit board 200 or 250 can be used for all power module output pads. The interposer printed circuit boards 200 and 250 are used as the only interconnect method for a power module 10. To solve the current carrying needs of the high current pads, multiple filled vias and heavy via plating are used to meet electrical and thermal requirements. The coplanarity needs of the power module 10 can be solved with solder bumps. Since these bumps will collapse during the customer reflow, it is not necessary for all of the bumps to be co-planar before customer reflow. Since the interposer printed circuit boards 200 and 250 have no discrete pins, the interposer printed circuit boards 200 and 250 can be used in applications which have co-planarity requirements which are less than 4 mils, enabling users to use stencil thicknesses from 1 mil to 5 mils thick or greater.

As shown in FIG. 9, the improvement in both thermal and electrical conduction (conductance) is proportional to the cross sectional area of the copper. In addition, both are inversely proportional to the distance that the heat and electricity need to travel. Due to the larger tolerance of the interposer board thickness compared to the discrete pin, a 72 mil nominal thickness interposer board would be needed to replace a 67 mil nominal thickness discrete pin. The cross sectional area of the interposer board copper is dependent on the number of vias and the plating thickness in the vias. FIG. 9 provides the calculation for the electrical resistance. The conductance is the inverse of the resistance. The improvement for the electrical conductance is calculated. This would be the same improvement factor for thermal conductance. For example, there are 24 vias with 2 mils of plating in the vias for the interposer board pad. This is compared to a discrete pin. The thermal and electrical conductance is 8.0 times better for the discrete pin compared to the interposer PCB pad with 24 vias with 2 mils of plating.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:

1. A direct current (DC) to direct current (DC) power converter comprising:
   a printed circuit board having a surface;
   an electrical component of a power conversion circuit mounted on the surface;
   a pin mounted on the surface and configured to transmit power signals; and
   an interposer printed circuit board mounted on the surface, the interposer printed circuit board comprising a pad that is configured to transmit control signals.

2. The DC-to-DC power converter of claim 1, wherein the pin is a discrete pin with greater thermal and electrical conductivity than a signal path through the interposer circuit board.

3. The DC-to-DC power converter of claim 1, wherein the pin is gold-plated.

4. The DC-to-DC power converter of claim 1, wherein:
   the electrical component has a first height orthogonal to the surface;
   the pin has a second height orthogonal to the surface, the second height being greater than the first height; and
   an outer solder bump positioned on the pad at a third height orthogonal to the surface, the third height being greater than the first height.

5. The DC-to-DC power converter of claim 4, wherein the third height is equal to the second height after a reflow soldering process alters the outer solder bump.

6. The DC-to-DC power converter of claim 4, further comprising an inner solder bump positioned between the interposer circuit board and the surface of the printed circuit board, wherein the third height is equal to the second height after a reflow soldering process alters the inner and outer solder bumps.

7. A direct current (DC) to direct current (DC) power converter comprising:
   a printed circuit board having a surface;
   an electrical component mounted on the surface, the electrical component having a first height orthogonal to the surface;
   a pin mounted on the surface, the pin having a second height orthogonal to the surface, the second height being greater than the first height; and
   an interposer printed circuit board mounted on the surface, the interposer printed circuit board comprising a pad and an outer solder bump positioned on the pad, wherein the outer solder bump is positioned at a third height orthogonal to the surface, the third height being greater than the first height.

8. The DC-to-DC power converter of claim 7, wherein the third height is equal to the second height after a reflow soldering process alters the outer solder bump.

9. The DC-to-DC power converter of claim 7, further comprising an inner solder bump positioned between the interposer printed circuit board and the surface of the printed circuit board.

10. The DC-to-DC power converter of claim 9, wherein the third height is equal to the second height after a reflow soldering process alters the inner and outer solder bumps.

11. The DC-to-DC power converter of claim 7, wherein the pin is a discrete pin with greater thermal and electrical conductivity than a signal path through the interposer circuit board.

12. The DC-to-DC power converter of claim 11, wherein the pin is configured to transmit power signals.

13. The DC-to-DC power converter of claim 7, wherein the pin is gold plated.

14. The DC-to-DC power converter of claim 7, wherein the pad is configured to transmit control signals.

15. The DC-to-DC power converter of claim 7, wherein the interposer printed circuit board comprises a plurality of top side pads and a plurality of bottom side pads, each of the plurality of top side pads being aligned with one of the plurality of bottom side pads.

16. The DC-to-DC power converter of claim 7, wherein the pin is configured to transmit power signals between the printed circuit board and a motherboard without the power signals passing through the interposer printed circuit board.

17. The DC-to-DC power converter of claim 1, wherein the pin is configured to transmit power signals between the printed circuit board and a motherboard without the power signals passing through the interposer printed circuit board.

* * * * *